United States Patent

Pickerd et al.

(10) Patent No.: US 7,271,575 B2
(45) Date of Patent: Sep. 18, 2007

(54) OSCILLOSCOPE BASED RETURN LOSS ANALYZER

(75) Inventors: John J. Pickerd, Hillsboro, OR (US); Laudie J. Doubrava, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 459 days.

(21) Appl. No.: 10/637,901

(22) Filed: Aug. 7, 2003

(65) Prior Publication Data

US 2004/0027138 A1 Feb. 12, 2004

Related U.S. Application Data

(60) Provisional application No. 60/401,903, filed on Aug. 7, 2002.

(51) Int. Cl.
G01R 23/00 (2006.01)
G01R 23/16 (2006.01)
G01R 27/06 (2006.01)

(52) U.S. Cl. ............... 324/76.19; 324/642; 324/646; 702/76; 702/106; 702/117

(58) Field of Classification Search ............. 324/76.19; 702/106

See application file for complete search history.

(56) References Cited

U.S. PATENT DOCUMENTS

| | | | | |
|---|---|---|---|---|
| 4,661,767 A | * | 4/1987 | Sharrit et al. ............... | 324/638 |
| 4,858,160 A | * | 8/1989 | Strid et al. .................. | 702/106 |
| 5,047,725 A | * | 9/1991 | Strid et al. .................. | 324/601 |
| 5,307,284 A | * | 4/1994 | Brunfeldt et al. ............ | 702/76 |
| 5,995,914 A | * | 11/1999 | Cabot .......................... | 702/109 |
| 6,292,760 B1 | * | 9/2001 | Burns .......................... | 702/189 |
| 6,549,862 B1 | * | 4/2003 | Huang et al. ................. | 702/77 |
| 6,798,830 B1 | * | 9/2004 | Tharakan ..................... | 375/224 |
| 6,813,566 B2 | * | 11/2004 | Hartley ........................ | 702/18 |

FOREIGN PATENT DOCUMENTS

EP   1111396 A2 * 6/2001

* cited by examiner

*Primary Examiner*—Walter Benson
*Assistant Examiner*—John Zhu
(74) *Attorney, Agent, or Firm*—Moser, Patterson & Sheridan, LLP; Francis I. Gray; Thomas F. Lenihan (57) ABSTRACT

A system, apparatus and method for performing differential return loss measurements and other measurements as a function of frequency uses a digital storage oscilloscope (DSO) having spectral analysis functions. A waveform generator generates a differential test signal in the form of a series of pulses where each pulse includes spectral components associated with each of a plurality of frequencies of interest. A test fixture presents the differential test waveform to a load including at least one of a device under test (DUT), a short circuit, an open circuit and a balanced load. A signal acquisition device differentially measures the test waveform during each of the load conditions. The signal acquisition device computes an error correction parameter using measurements made during the short circuit, open circuit and balanced load conditions. The correction parameter tends to offset signal acquisition errors within measurements made during the DUT load condition.

19 Claims, 6 Drawing Sheets

OSCILLOSCOPE BASED RETURN LOSS ANALYZER

CROSS-REFERENCE TO RELATED APPLICATIONS

This patent application claims the benefit of U.S. Provisional Patent Application Ser. No. 60/401,903, filed on Aug. 7, 2002, for OSCILLOSCOPE BASED RETURN LOSS ANALYZER, which is incorporated herein by reference in its entirety.

FIELD OF THE INVENTION

The invention relates generally to signal acquisition systems and, more particularly, to a system, apparatus and method enabling an oscilloscope to perform differential return loss and other measurements as a function of frequency.

BACKGROUND OF THE INVENTION

Return loss measurements, and other measurements within the context of, illustratively, 1000BaseT (gigabit Ethernet) performed as a function of frequency are typically made using network analyzers, which tend to be very expensive. To reduce total cost, one network analyzer work station is often shared by multiple oscilloscope work stations within the context of a testing environment. As an alternative, time division reflectometry (TDR) oscilloscopes have been produced which include algorithms capable of transforming time domain results into frequency domain results similar to those provided by a network analyzer. However, it is generally perceived that the combination of TDR oscilloscopes and dedicated software packages adapted to compute the time domain parameters and convert these parameters into frequency domain parameters are more difficult to use than conventional network analyzers.

The use of oscilloscopes within the context of network analyzer functions has also been deemed suspect due to the nominal 8-bit dynamic range of standard analog-to-digital converters used in oscilloscopes. As such, test and measurement solutions generally implemented by users tend to employ both network analyzer work stations and oscilloscope work stations to perform, respectively, frequency domain testing tasks and time domain testing tasks.

SUMMARY OF INVENTION

These and other deficiencies of the prior art are addressed by the present invention of a system, apparatus and method for performing differential return loss measurements and other measurements as a function of frequency.

Specifically, a system according to one embodiment of the invention has a waveform generator for generating a differential test signal in the form of a series of pulses where each pulse includes spectral components associated with each of a plurality of a frequencies of interest; a test fixture adapted to present the differential test waveform to a load including at least one of a device under test (DUT), a short circuit, an open circuit and a balanced load; and a signal acquisition device adapted to differentially measure the test waveform during each of the load conditions. The signal acquisition device computes an error correction parameter using measurements made during the short circuit, open circuit and [a] balanced load conditions. The correction parameter tends to offset signal acquisition errors within measurements made during the DUT load condition.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The subject invention is primarily described within the context of a test setup or system using one or more digital storage oscilloscopes (DSOs) having spectral analysis functionality. However, it is understood by those skilled in the art that the invention may be advantageously employed using any signal measurement or analysis devices in which the below-described functionality is included. The subject invention is well suited to performing differential return loss measurements and other measurements as a function of frequency within, for example, the context of Infiniband, 1000BaseT and other serial data standards.

Figure 1:
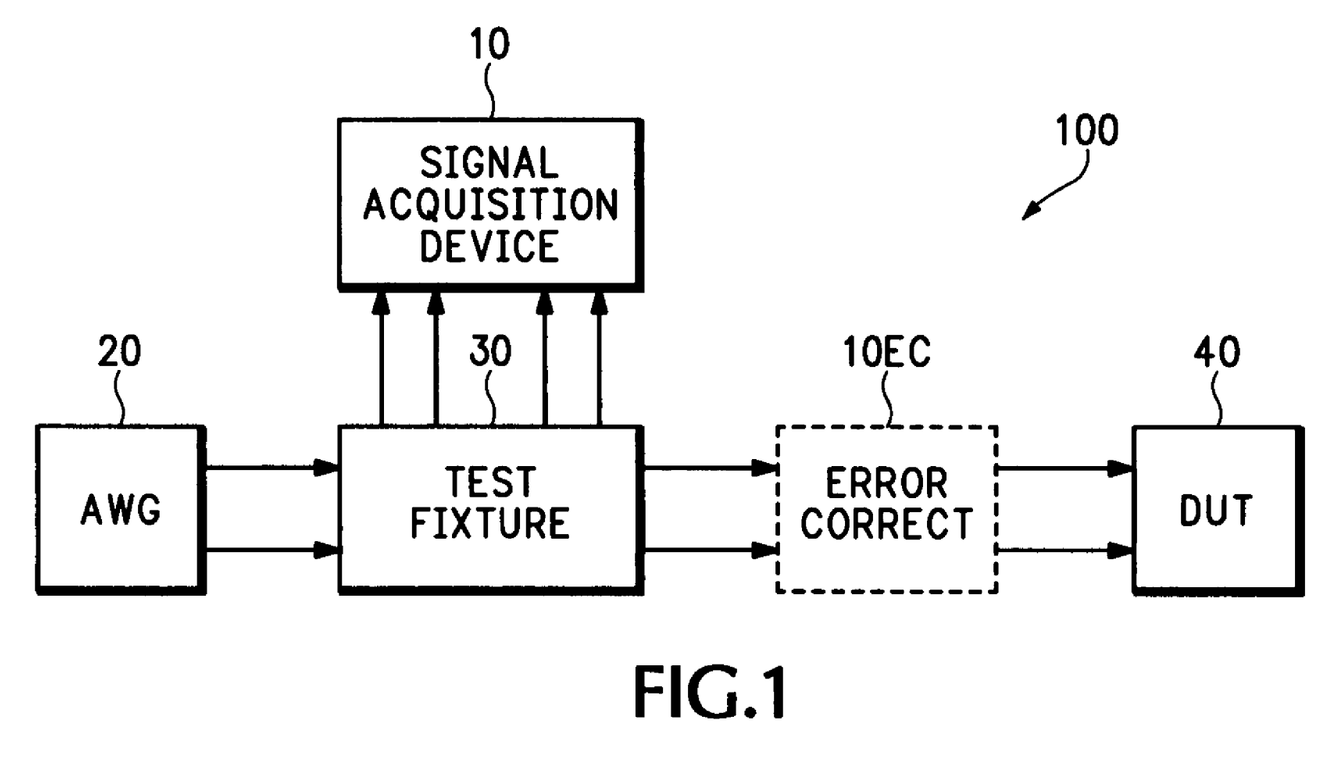
FIG. 1 depicts a high level block diagram of a testing system according to an embodiment of the present invention.

FIG. 1 depicts a high level block diagram of a test system 100 according to an embodiment of the invention. Specifically, the test system 100 of FIG. 1 has an arbitrary waveform generator (AWG) 20 which provides a differential test signal of an arbitrary waveform having signal energy at each of a plurality of frequencies of interest to a test fixture 30. Test fixture 30 couples the differential test signal to a device under test (DUT) 40. Test fixture 30 also cooperates with a signal acquisition device 10 which, preferably, receives differential signals from test fixture 30 indicative of a response of the DUT 40 to the arbitrarily generated waveform produced by AWG 20. An error correction function 10EC is depicted as a functional element between the test fixture 30 and DUT 40. However, the error correction function 10EC does not have a physical functional element. Rather, the error correction element 10EC has signal correction and/or calibration functions imparted by the signal acquisition device 10 to the signals measured at test fixture 30.

As is discussed in more detail below, during a calibration or characterization procedure, the response of the test fixture 30 itself and its associated circuitry to the arbitrarily generated waveform is measured at each of a short circuit, open circuit, and balanced load condition to derive thereby system calibration or characterization information. This derived system calibration or characterization information is then processed by the signal acquisition device 10 along with actual responses by the device under test 40 to derive thereby an error correction function 10EC. The error correction function 10EC is used to offset those measurement errors or system characterizations not attributable to the DUT 40. In this manner, a more accurate representation of return loss and other functions or measurements associated with the DUT 40 is obtained.

Figure 2:
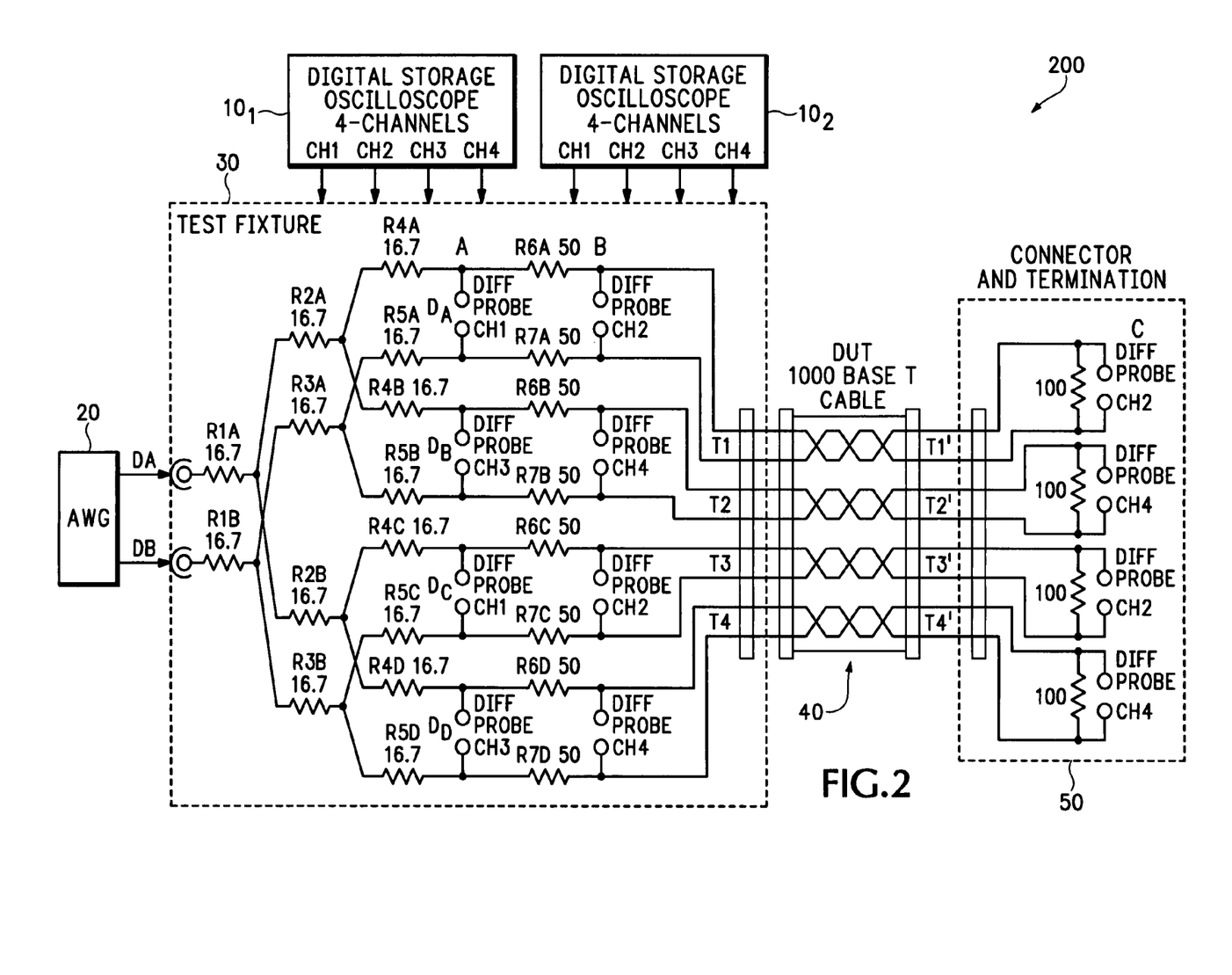
FIG. 2 depicts a more detailed view of the embodiment of the test system of FIG. 1.

FIG. 2 depicts a more detailed view of the embodiment of the test system of FIG. 1. Specifically, the test system 200 of FIG. 2 has a signal acquisition device 10 implemented as a pair ($10_1$, $10_2$) of four-channel differential input digital storage oscilloscopes, an arbitrary waveform generator 20, a test fixture 30, a device under test 40 and a termination fixture 50. The device under test is, illustratively, a 1000BaseT cable which is coupled between the test fixture 30 and termination fixture 50. Within the context of the 1000BaseT example, a reference impedance $Z_O$ is 100 ohms and a sum of sine waves at all the desired frequencies to test at is in the range of 1.0 MHz to 100 MHz.

AWG 20 provides non-inverting DA and inverting DB portions of a differential test signal D to the test fixture 30 (alternatively, DA and DB may be, respectively, inverting and non-inverting portions).

Generally speaking, an impulse function is described within the time domain as an instance of a very large (ideally approaching infinite) amount of energy concentrated in a very small (ideally approaching zero) temporal region bounding a temporal reference point. The impulse is constructed by combining a very large number of sine waves (ideally infinite) that have respective peaks at the temporal reference point and different periods.

In one embodiment, the spectral characteristics of the differential test signal D are a substantially random or pseudo random spectral energy distribution formed by a finite number of sine waves (illustratively 500) where the sine waves represent frequencies of interest and are slightly offset from each other in phase (e.g., randomly assigned phase offsets). The test signal is adapted to achieve, in this embodiment, a relatively even distribution of energy across the spectrum of interest. In this manner, an improved signal to noise ratio of the final measurement is realized. The phases of the sine waves are adjusted in a manner tending to cause a relatively even distribution of energy over time (i.e., a waveform with a random spectral distribution appearance), while the spectral regions are spectral regions of interest or frequencies of interest. As is understood by those skilled in the art and informed by the teachings of the present invention, the spectral characteristics (frequencies of interest, average energy, phasing and the like) may be adapted to present different frequencies of interest to the test fixture 30 and DUT 40. In various embodiments of the invention 100, 500 or more sine waves within the time domain are added together to produce the waveform. While in various embodiments frequency domain inspection of the waveform yields lobes of equal magnitudes spaced by constant frequency steps, any desired number of frequencies and spectral and/or temporal spacings may be employed depending upon the application.

In one embodiment, a phasing adjustment is made manually based on empirical data. In another embodiment an automated phase adjustment function is used in which energy distributions are measured and the mathematical representations of the sine waves are adjusted within the AWG. For example, where the AWG 20 receives waveform function instructions in the form of output from a mathematical processing program (e.g., MathCAD, manufactured by Mathsoft), the mathematical processing program adapts a waveform function model based upon manual input or energy measurements to realize thereby the appropriate phasing of the sine waves used to generate the ultimate waveform at the AWG output.

The waveform produced by the AWG is represented as a series of pulses within the frequency domain, where each pulse has a relatively low amplitude and is separated from adjoining pulses by a frequency difference ?f. It is noted that the use of fewer sine waves of appropriate phase results in improved signal to noise ratio.

Figure 6:
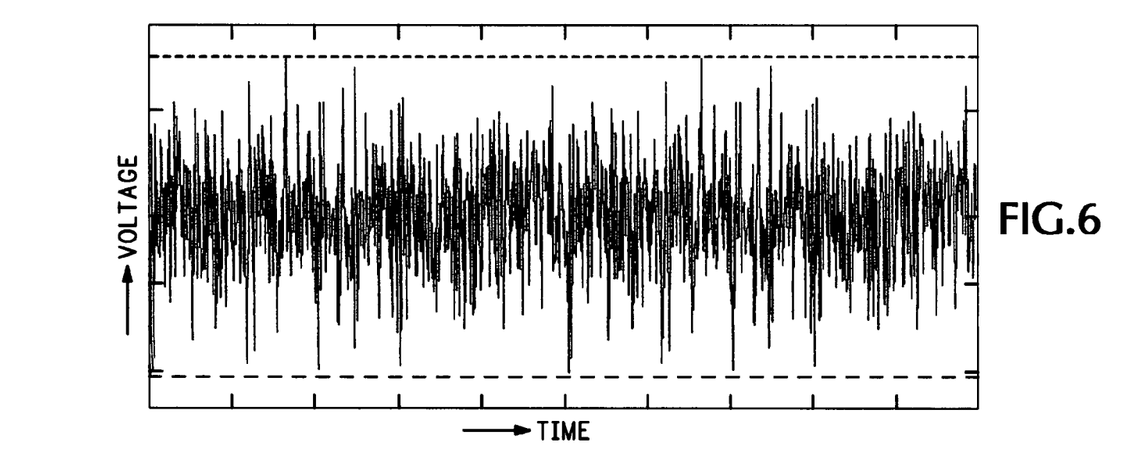
FIGS. 6-7 depict graphical representations of an arbitrarily generated waveform.
Figure 7:
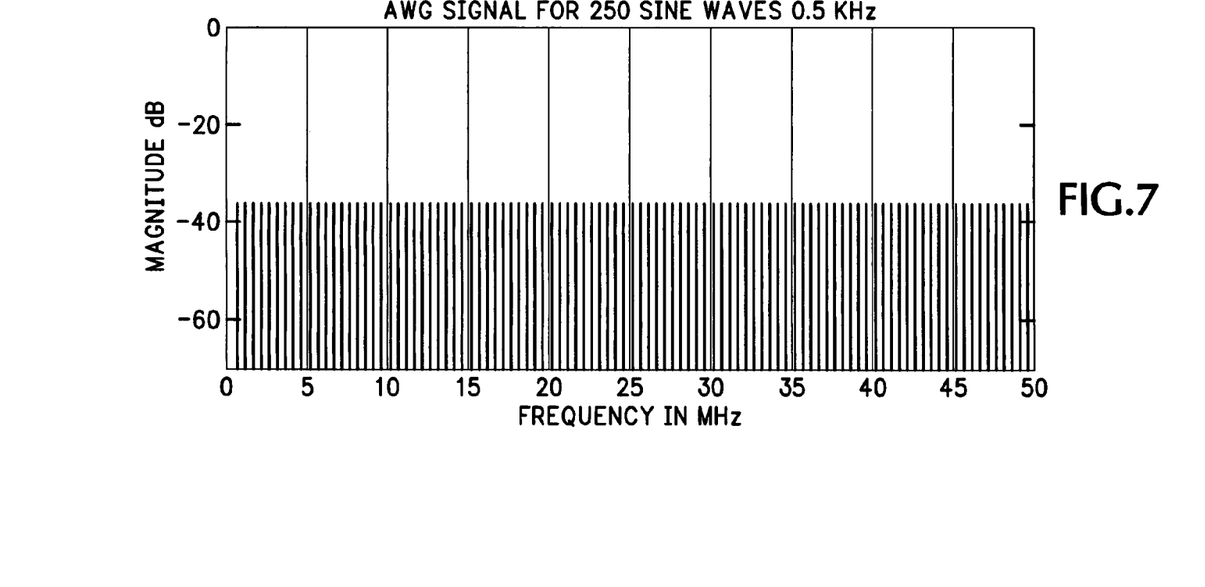

FIGS. 6-7 depict graphical representations of an arbitrarily generated waveform. Specifically, FIG. 6 depicts an AWG signal with 250 sine waves having 0.5 kHz phase offsets added together in which the resulting waveform voltage is plotted as a function of time. This illustrates how the time domain view of an AWG waveform as discussed herein may emulate pseudorandom noise signal. FIG. 7 depicts the AWG signal of FIG. 6, but with waveform magnitude in dB plotted as a function of frequency in Hz. It is important to note that the waveforms of FIGS. 6-7 may be modified by using more or fewer sine waves, by summing different functions (e.g., cosine, impulse, ramp and the like) and by combining different energy levels, including the variations discussed herein and elsewhere in this application.

Test fixture 30 splits the power of the received differential arbitrarily generated waveform signal D into four differential test signals T1-T4. Specifically, the non-inverting DA portion of the differential signal D is conveyed along the T1 signal path via the following series-coupled arrangement of resistors in the order named, R1A, R2A, R4A, and R6A. The inverting DB portion of the differential signal D is conveyed along the T1 signal path via the following series-coupled arrangement of resistors in the order named, R1B, R3A, R5A, and R7A.

The non-inverting DA portion of the differential signal D is also conveyed along the T2 signal path via the following series-coupled arrangement of resistors in the order named, R1A, R2A, R4B, and R6B. The inverting DB portion of the differential signal D is conveyed along the T2 signal path via the following series-coupled arrangement of resistors in the order named, R1B, R3A, R5B, and R7B.

The non-inverting DA portion of the differential signal D is also conveyed along the T3 signal path via the following series-coupled arrangement of resistors in the order named, R1A, R2B, R4C, and R6C. The inverting DB portion of the differential signal D is conveyed along the T3 signal path via the following series-coupled arrangement of resistors in the order named, R1B, R3B, R5C, and R7C.

The non-inverting DA portion of the differential signal D is also conveyed along the T4 signal path via the following series-coupled arrangement of resistors in the order named, R1A, R2B, R4D, and R6D. The inverting DB portion of the differential signal D is conveyed along the T4 signal path via the following series-coupled arrangement of resistors in the order named, R1B, R3B, R5D, and R7D.

The circuit described above with respect to resistors R1 through R5 comprises a 1 to 4 power splitter which operates to split the power of the differential signal D produced by AWG 20 into four lower power differential test signals.

Each of the four T1-T4 differential test signals has associated with it a respective test point A, where each test point A comprises two terminals adapted to receive a differential probe operatively coupled to the signal acquisition device 10. The differential probe receives differential signals (i.e., signals referenced to each other rather than to ground) via a pair of probe tips and converts the differential signal to a single-ended signal for coupling to an input channel of a digital storage oscilloscope (DSO $10_1$ or $10_2$).

Each of the four differential test signals T1-T4 has associated with it a respective test point B, where each test point B comprises two terminals adapted to receive a differential probe operatively coupled to the signal acquisition device 10 (e.g., to a respective input channel of DSO $10_1$ or $10_2$).

It is noted that the in-line (i.e., series) resistors R6 and R7 within the differential output channels have values selected to correspond to a characteristic impedance $Z_O$ of 100 ohms (i.e., 50+50 ohms). Resistors R6 and R7 are adjusted as necessary depending upon the characteristic impedance $Z_O$ of the device under test. For example, given a 50 ohm characteristic impedance, each of resistors R6 and R7 is selected to be a 25 ohm resistor.

In the example of FIG. 2, the DUT 40 comprises a 1000BaseT cable which receives each of the four differential test signals T1-T4 at respective input terminal pairs and conducts test signals received therefrom to respective output terminal pairs as test signals T1'-T4'.

The termination fixture 50 is disposed in a 1000BaseT load configuration, providing a resistive load of 100 ohms (i.e., the characteristic impedance $Z_O$ of the 1000BaseT cable under test) to each of the output terminal pairs such that each of the test signals T1'-T4' is appropriately loaded. Each of the characteristic impedance loads forms, thereacross, a respective test point C, which test point C is adapted to receive a differential probe operatively coupled to the signal acquisition test instrument 10 (e.g., to a respective input channel of DSO $10_1$, $10_2$).

Figure 3:
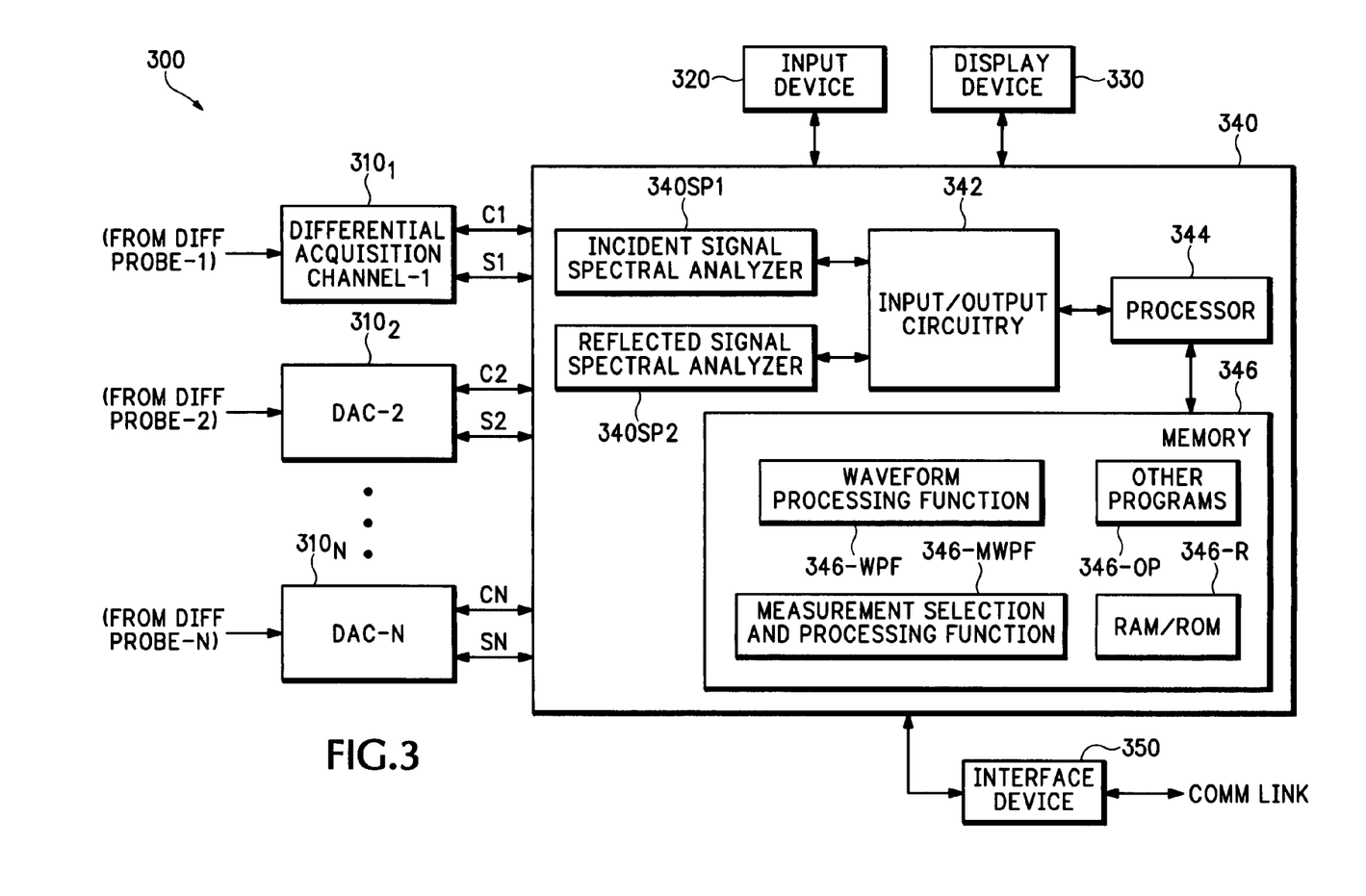
FIG. 3 depicts a high level block diagram of a signal acquisition device suitable for use in the testing systems of FIG. 1 or FIG. 2.

FIG. 3 depicts a high-level block diagram of a signal acquisition device suitable for use in the testing systems of FIG. 1 or FIG. 2. Specifically, the signal acquisition device 300 of FIG. 3 comprises an N-channel input digital storage oscilloscope (DSO). In the case of the system 200 of FIG. 2, the signal acquisition device 300 may be used to implement each of signal acquisition devices $10_1$, $10_2$ as a 4-channel input DSO.

The signal acquisition device 300 of FIG. 3 has a plurality of acquisition channels $310_1$ through $310_N$ (collectively acquisition channels 310), at least one input device 320, at least one display device 330 and a controller 340.

Each of the acquisition channels 310 has analog-to-digital (A/D) conversion circuitry, triggering circuitry, decimator circuitry, acquisition memory and the like adapted for receiving and acquiring samples of a input signal from a respective differential probe. Each of the acquisition channels 310 communicates with the controller 340 via respective control signals C1-CN. Each of the acquisition channels 310 provides a respective sample stream (S1-SN) to the controller 340 for further processing.

The input device 320 comprises a key pad, pointing device or other input device. The display device 330 comprises a cathode ray tube (CRT), liquid crystal display (LCD) or other display device.

The controller 340 is used to manage the various operations of the signal acquisition device 300. The controller 340 performs various processing and analysis operations on data samples received from acquisition channels 310 or stored within a memory 346. Specifically, the controller 340 comprises a processor 344, input/output (I/O) circuitry 342, memory 346, an incident signal spectral analyzer 340SP1 and a reflected signal spectral analyzer 340SP2. While the spectral analyzers 340SP1 and 340SP2 are depicted as being part of the controller 340, it is understood by those skilled in the art and informed by the teachings of the present invention that these functional elements may be implemented separately from the remaining functional elements forming the controller 340. For example, the spectral analyzers 340SP1 and 340SP2 may be add-on circuit boards which may be installed as optional equipment on an oscilloscope to upgrade that oscilloscope to perform the functions described herein.

The memory 346 stores various programs such as a waveform processing function 346-WPF, a measurement selection and processing function 346-MSPF, various other programs 346-OP (e.g., operating system, AWG control program, AWG waveform selection program) and random access memory (RAM)/read only memory (ROM) 346-R. While not shown, various conventional support circuitry including power supplies, clock circuits, cache memory and the like as well as circuits that assist in executing the software routines stored in the memory 346 are also associated with the controller 340. The input/output (I/O) circuitry 342 forms an interface between the various functional elements communicating with the controller 340. For example, the controller 340 may communicate with the acquisition channels 310, one or more input devices 320, one or more display devices 330, a computer bus or communications channel and the like. The controller 340 optionally communicates with a communications link COMM LINK such as a general purpose interface bus (GPIB), Ethernet or other communications link via a respective interface device 350.

Although the controller 340 of FIG. 3 is depicted as a general purpose computer that is programmed to perform various control functions in accordance with the present invention, the invention can be implemented in hardware as, for example, an application specific integrated circuit (ASIC) or field programmable gate array (FPGA). As such, the process and method steps described herein are intended to be broadly interpreted as being equivalently performed by software, hardware or a combination thereof.

The incident signal spectral analyzer 340SP1 and reflected signal spectral analyzer 340SP2 are preferably realized as special purpose processing elements suitable for processing the large amounts of data necessary to perform fast Fourier transform (FFT) and other frequency-domain processing functions. As previously noted, AWG 20 of FIGS. 1 and 2 establishes a test wave form having energy within each of a plurality of spectral regions of interest (e.g., a plurality of desired spectral regions contained within the summation of sine waves), wherein the incident signal spectral analyzer 340SP1 analyzes the test signal supplied to a DUT, while the reflected signal spectral analyzer 340SP2 analyzes the reflected signal (if any) provided by the DUT.

The waveform processing function 346-WPF performs various mathematical and signal processing functions within the context of waveforms received from, for example, the incident 340SP1 and reflected 340SP2 spectral analyzers. Specifically, in one embodiment, the math function/algorithm used to obtain an uncorrected return loss measurement is performed in the following manner (this procedure is without calibration error correction):

(1) Connect CH1 of oscilloscope to the input of reference impedance (test point A), CH2 of oscilloscope to input of DUT cable under test (test point B) and the AWG to the test fixture signal input. Set up the desired spectral span of interest using a user interface.

(2) Establish a math expression: Math3=(2.0*CH2)−CH1.

(3) Establish a math expression: Math1=spectralMag (Math3), which means compute the FFT log magnitude of Math3 and keep only the peak value at the frequencies corresponding to the sine waves in the AWG signal.

(4) Establish a math expression: Math2=spectralMag (CH1), which means compute the FFT log magnitude of CH1 and keep only the peak value.

(5) Establish a math expression: Math4=Math2−Math1, which provides the return loss.

It should be noted that only values generated at the frequencies of interest are stored, and that the above math functions may be embedded into an application without using the waveform math expression capability of the oscilloscope.

Return loss is defined in various standards as:

Return loss=−20*log(reflected/incident)

Network analyzers normally display return loss with the minus sign as shown in the previous equation:

Return loss=20*log(reflected/incident)

The above equation may be factored as:

Return loss=20*log(reflected)−20*log(incident)

The reflected and incident signals may be derived from the sine wave input to CH1 and CH2 of the oscilloscope (e.g., $10_1$). They are obtained from the test fixture. Reflected is proportional to $Z-Z_O$. Where Z is the impedance of the DUT and $Z_O$ is the characteristic reference impedance. Therefore:

reflected=CH2−(CH1−CH2)

reflected=(2*CH2)−CH1

Let: Math3=(2*CH2)−CH1

The incident signal may be computed as follows using the transmitted signal minus the voltage across Z representing the DUT. In terms of impedance, the incident is proportional to $Z+Z_O$.

Incident=CH2+(CH1−CH2)

Incident=CH1

Let: Math2=AVG(SpectralMag(CH1))

where Math2 is an expression in the waveform math package of the oscilloscope. The log magnitude of the FFT at the frequency of the signal generator is the desired value that is used. Spectral results at other frequencies are ignored. AVG implies that several acquisitions of this waveform are averaged.

Let: Math1=AVG(SpectralMag(Math3))

where Math3 is an expression in the waveform math package of the oscilloscope. The log magnitude of the FFT at the frequency of the signal generator is the desired value that is used. Spectral results at other frequencies are ignored.

Let: Math4=Math2−Math1 where Math2 represents the magnitude of the incident signal and Math1 represents the magnitude of the reflected signal. These math waveforms are only valid at frequency points that are equal to frequencies of the sine waves from the AWG. In the case of a swept sine wave generator only the point at the frequency of the generator for the given acquisition are valid. All others are ignored.

The measurement selection and processing function 346-MSPF provides (either singly or in conjunction with other programs 346-OP), via the display device 330, a user interface implementing a network analysis control menu for use in the DSO 300 of FIG. 3. An illustrative user interface has a plurality of dialog boxes, pull down menus and other on-screen user manipulable objects which enable user selection (via the input device 320) of various parameters. Specifically, user selected parameters within a preferred user interface are those associated with frequency selection, those associated with calibration, and those associated with measurements.

In a frequency menu, a user is enabled to select various setup parameters adapted to correspond with test signals provided by AWG 20. Specifically, start frequency and stop frequency selections enable the user to denote, respectively, the highest and lowest frequencies to be measured. A step selector defines the difference in frequency between sine waves used by the AWG to produce the test waveform. A resolution bandwidth selector optionally defines the resolution bandwidth at which the return loss measurement will be performed.

In a measurement menu, a user is enabled to select from multiple sets of measurements such as return loss, transmission coefficient, return angle, transmission angle, impedance and the like.

In a calibration menu, a user is enabled to select from multiple calibration operations appropriate to the test system. For example, upon replacing a DUT with a calibrated short, the user activates a "short" button or icon to implement the short circuit calibration measurements. When this function is achieved, the user replaces the DUT with a calibrated open circuit and activates an "open" icon or button to implement the open circuit calibration function. When this function is complete, the user replaces the DUT with a calibrated load impedance ($Z_O$) and activates a "load" icon or button to initiate the load calibration function. An optional visual indication may be used to inform a user when a calibration process is complete. Optionally, a "clear waveform" button or icon may be activated by a user to cause the averaging of the return loss spectrum to be reset.

The invention is primarily described above with respect to a test waveform having a sum of sine wave functions of different frequencies. However, it is noted that the subject invention may be utilized within the context of a swept sine wave generator wherein each of the frequencies of interest is provided to test fixture 30 by AWG 20 for a predefined time period. In such an embodiment of the invention, the measurement selection and processing function 346-MSPF includes menu and user interface functions appropriate to a swept sine wave test waveform. The measurements that may be selected by a user are in one embodiment derived from algorithmic computations that use the oscilloscope's internal FFT based spectrum analyzer along with waveform math. Thus, a means is provided to select the start and stop frequencies for analysis. In an alternate embodiment, the FFT function is implemented using Matlab or a similar program, thereby avoiding the use of an internal spectral analyzer within the oscilloscope (especially useful where such internal spectral analyzer function does not exist in a particular oscilloscope).

In a spectral sweep mode of operation, a user menu is presented that represents a spectrum analysis mode of operation in which the input signal to the system is normally expected to be a swept sine wave. Spectrum analysis on that signal is performed with waveform math and FFT algorithms. Since the input signal in this instance is a single sine wave, only the peak of the spectrum is of interest for the measurements to be performed. Therefore, the resulting spectral waveform is obtained over multiple trigger acquisitions where only a single point from the peak spectral signal is kept and combined with points from previous acquisitions. The frequency menu provides a means of selecting a start frequency, a stop frequency and resolution bandwidth as controls directly related to the spectrum analyzers. This set of frequency controls may be used to directly drive the time base parameters of sample rate and record length so that the requested start and stop frequencies are obtained. The sample rate and record length refers to the number of samples per second acquired by A/D converters within the acquisition channels 310 and the record length refers to the amount of data acquired.

Figure 4:
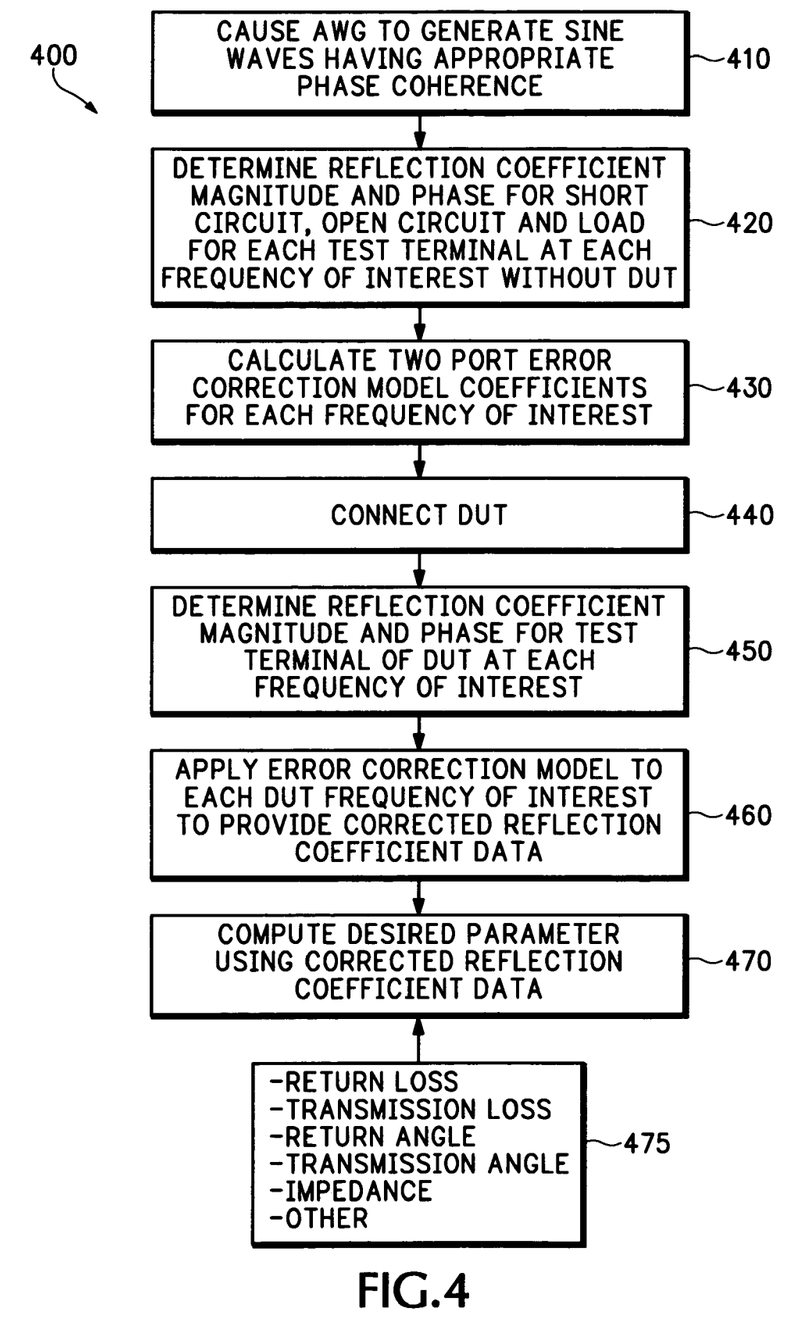
FIG. 4 depicts a flow diagram of a method according to an embodiment of the present invention.

FIG. 4 depicts a flow diagram of a method according to an embodiment of the present invention. Specifically, the method 400 of FIG. 4 is suitable for use within the testing systems discussed above with respect to FIGS. 1 and 2. Portions of the methodology 400 of FIG. 4 are executed by hardware and/or software components within a signal acquisition device such as the DSO 300 discussed above with respect to FIG. 3. The specific steps discussed herein with respect to FIG. 4 are adapted to the testing system 200 discussed above with respect to FIG. 2. It is understood by those skilled in the art and informed by the teachings of the present invention that the method 400 of FIG. 4 may be readily adapted to alternate embodiments of the testing system 200 described above.

At step 410, arbitrary waveform generator 20 is caused to generate sine waves having appropriate phase coherence. That is, at step 410 the AWG produces an arbitrary waveform, preferably the differentially presented arbitrary waveform, wherein a plurality of sine waves are summed together.

At step 420, the reflection coefficient magnitude and phase are determined for each of a short circuit, open circuit and load condition for each test terminal at each frequency of interest for the test fixture 30 without the device under test 40. That is, at step 420, the differential test signals provided by AWG 20 are propagated through the test fixture 30 to each of the test points (e.g., T1-T4) adapted to communicate with a DUT. Each of these test points is terminated, in sequence, with a short circuit, an open circuit and a load impedance (using, e.g., variations of the termination fixture 50). For each termination, the reflection coefficient magnitude and phase is determined by, for example, the reflected signal spectral analyzer 340SP2 within the appropriate DSO $10_1$ or $10_2$ within the testing system 200 of FIG. 2.

At step 430, the two port error correction model coefficient for each of the frequencies of interest is calculated. That is, at step 430 the controller 340 of the DSO 300 of FIG. 3 utilizes the determinations provided by the reflected signal spectral analyzer 340SP2 in conjunction with the waveform processing function 346-WPF to calculate appropriate coefficients for a two port error correction model adapted to characterize the dynamic operating conditions of the signal generation, test fixture signal propagation and measurement functions present at the test terminals T1-T4 for the various frequencies of interest under the three load conditions.

In one embodiment, the following equations are used:

$\Gamma m1 = a.\Gamma A1 + b - c.\Gamma A1.\Gamma m1$ $\Gamma m2 = a.\Gamma A2 + b - c.\Gamma A2.\Gamma m2$ $\Gamma m3 = a.\Gamma A3 + b - c.\Gamma A3.\Gamma m3$ The reflection coefficients $\Gamma A1$, $\Gamma A2$ and $\Gamma A3$ are for the loads of open, short and Z0. Thus, the equation simplifies by substituting positive 1 or minus 1 for open or short, and 0 for Z0. Once the values of a, b, and c are solved from the above system of equations, then it is possible to compute the value of $\Gamma A$. The procedure is to replace the DUT with three different known loads and then make measurements for $\Gamma m$. This is done by using a short, an open, and a Z0 termination. The values of a, b, and c are the three error correction terms that are computed as a function of frequency based on short, open and load measurements to obtain the three equations above. Specifically, each of the coefficients a, b and c is an array of complex numbers in the frequency domain that together provide a set of coefficients or error correction parameters useful in implementing the error compensation function of the present invention.

Thus $\Gamma A$ may then be computed from the following, where $\Gamma m$ is the measured reflection coefficient and $\Gamma A$ is the error corrected result:

$$\Gamma A = \frac{\Gamma m - b}{a - c.\Gamma m}.$$

In this manner it is possible to measure $\Gamma m$ with three different loads and then write three different equations. This allows for the solution for values of a, b, and c at each frequency of interest.

Further, the return loss parameter may be calculated as:

$$\text{Return loss} = -20\log\frac{\Gamma m - b}{a - c.\Gamma m}.$$

At step 440, a device under test (DUT) is connected to the test fixture output terminals. For example, as discussed above with respect to FIG. 2, a 1000BaseT cable is connected to the output terminals of the test fixture 30.

At step 450, the reflection coefficient magnitude and phase is determined for the test terminal of the DUT at each of the frequencies of interest.

At step 460, the error correction model calculated at step 430 is applied to each frequency of interest for the reflection coefficient magnitude and phase determined at step 450 such that corrected reflection coefficient data is provided. That is, at step 460 the error conditions or characterization calculated at step 430 as a two port error correction model is applied to the data determined at step 450 such that perturbations to the data determined at step 450 induced by the characteristics of the test system are compensated for or otherwise offset from the data determined at step 450.

At step 470, the desired parameter is computed using the corrected reflection coefficient data. As noted with respect to box 475, the desired parameter may comprise a return loss parameter, a transmission coefficient or parameter, a return angle parameter, a transmission angle parameter, an impedance parameter or some other frequency-related parameter.

Figure 5:
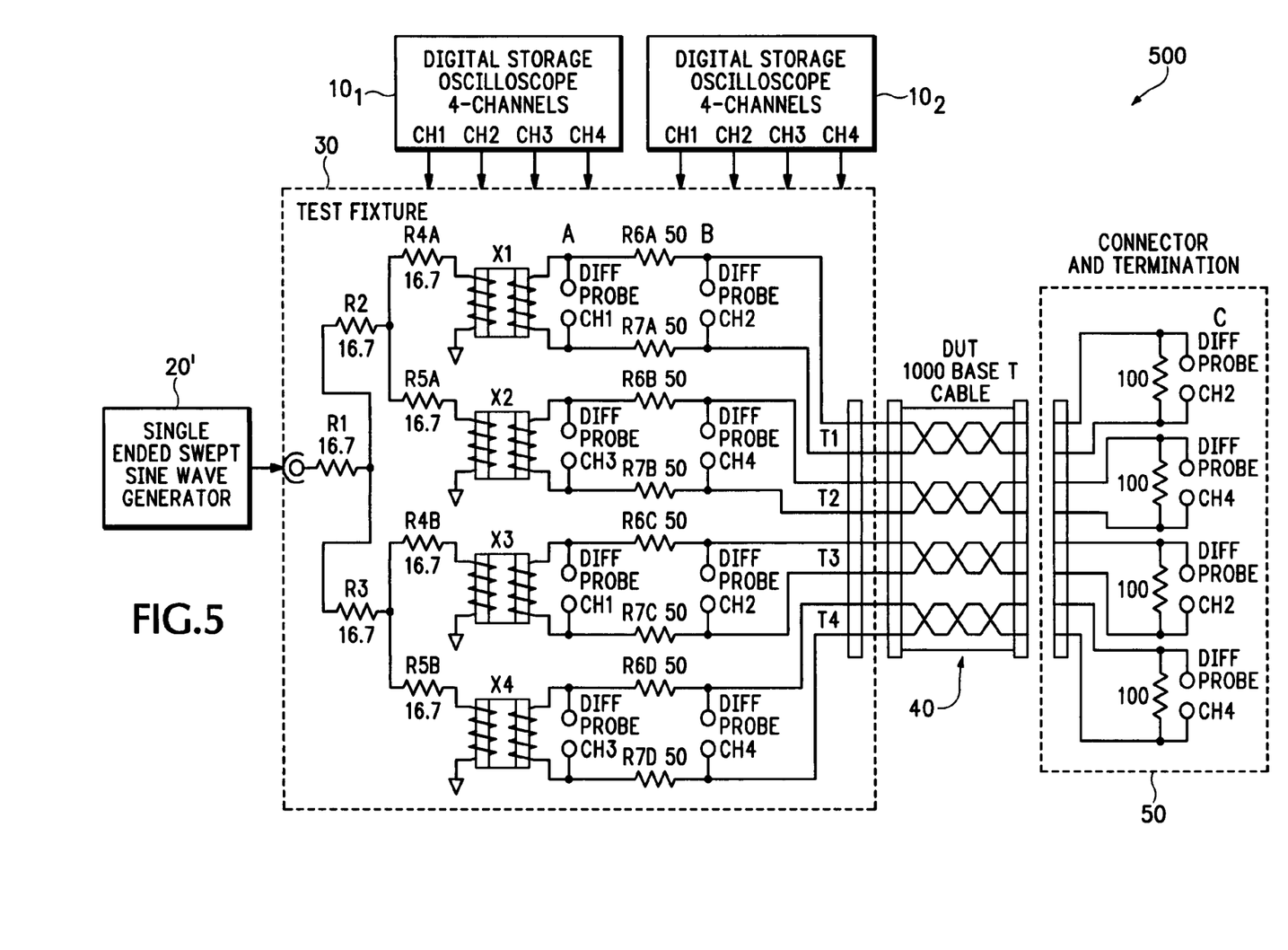
FIG. 5 depicts an alternate embodiment of the test system of FIG. 2.

FIG. 5 depicts an alternate embodiment of the test system of FIG. 2. Specifically, the test system 500 of FIG. 5 utilizes a single ended swept sine wave generator 20' rather than the arbitrary waveform generator 20 utilized in the system 200 of FIG. 2. Moreover, the topology of the test fixture 30 is adapted to provide appropriate test signals to the DUT 40 from the single ended swept sine wave generator 20'. The test system 500 of FIG. 5 includes the digital storage oscilloscopes $10_1$, $10_2$, the DUT 40 and termination fixture 50 which operate in substantially the same manner as discussed above with respect to FIG. 2. The differences between the system 200 of FIG. 2 and the system 500 of FIG. 5 will now be discussed.

The single ended swept sine wave generator 20' provides a swept sine wave output signal referenced to ground wherein frequencies of interest are periodically delivered to the test fixture 30. The test fixture 30 receives the test signal provided by the swept sine wave generator 20' at one end of a 16.7 ohm resistor R1. The other end of R1 is coupled to one end of each of 16.7 ohm resistors R2 and R3. The other end of R2 is coupled to one end of each of 16.7 ohm resistors R4A and R5A. The other end of R3 is coupled to one end of each of resistors 16.7 ohm resistors R4B and R5B. The other ends of each of R4A, R4B, R5A and R5B are coupled to ground via a primary winding of a respective transformer X1, X2, X3 and X4. Test point A is taken across the secondary winding of each of the respective transformers X1-X4. For the 1000BaseT application, each end of the secondary windings of the respective transformers X1-X4 is coupled to respective ones of the dual output test terminals T1-T4 via respective in-line 50 ohm resistors R6A, R7A (X1); R6B, R7B (X2); R6C, R7C (X3); and R6D, R7D (X4).

Broadly speaking, the above-described embodiment of a test system according to the invention is implemented using, for example, the following devices and/or functions: (1) a digital storage oscilloscope including therein two instances of an embedded spectral analyzer for obtaining the magnitude of incident and reflected signals at various frequencies of interest, a waveform math feature allowing arbitrary math functions to be defined (either predefined or controllably defined), a menu system adapted for user control of a calibration process and measurement process, and a display system adapted to display return loss measurement (and other measurement) graphs, cursers, readouts and the like; (2) an arbitrary waveform generator (AWG) to generate sine waves at each of a plurality of desired test frequencies and, preferably, to simultaneously generate such sine waves (the AWG may be single ended or, preferably, differential output); (3) a test fixture comprising a four way power splitter, reference impedance, oscilloscope differential probe connection pins, a connector to a cable under test or device under test (DUT), a termination connector to the cable under test or DUT including short circuit, open circuit and balance load ($Z_O$), the power splitter may be replaced with relays and/or baluns where only one cable pair at a time is excited for measurement; and (4) differential probes to connect the test fixture to the DSO.

While the foregoing is directed to the preferred embodiment of the present invention, other and further embodiments of the invention may be devised without departing from the basic scope thereof, and the scope thereof is determined by the claims that follow.

What is claimed is:

1. A method of determining a characteristic parameter of a device under test (DUT), comprising:
   determining, using a test signal having spectral components associated with each of a plurality of frequencies of interest, and for each of a short circuit, open circuit and balanced load condition, a reflection coefficient magnitude and phase of a testing system output port;
   calculating error correction terms adapted to substantially compensate for the determined reflection coefficient magnitude and phase of the testing system output port under the load conditions;
   causing the application of said test signal to a device under test (DUT) operatively coupled to said output port;
   measuring a response of said DUT to said test signal; and
   correcting said measured response of said DUT using said calculated error correction terms to produce a corrected measurement result that represents said characteristic parameter of said DUT in the form of a return loss parameter calculated using an equation of the following form:

$$\text{Return loss} = -20\log\frac{\Gamma m - b}{a - c.\Gamma m}.$$

2. The method of claim 1, wherein said test signal is generated by summing a plurality of sine waves having amplitude and phase parameters selected to provide energy at each of said frequencies of interest.

3. The method of claim 1, wherein:
   said phase parameters of said sine waves are adjusted to cause a relatively even distribution of signal energy over said frequencies of interest.

4. The method of claim 1, wherein said test signal is generated by summing a plurality of sine waves having phase parameters selected to provide energy at each of said frequencies of interest.

5. The method of claim 1, wherein said characteristic parameter of said DUT comprises in addition to the return loss parameter at least one of a transmission coefficient, a return angle parameter, a transmission angle parameter and an impedance parameter.

6. The method of claim 1, wherein said error correction terms comprise coefficients a, b and c calculated using equations of the following form:

$$\Gamma m1 = a.\Gamma A1 + b - c.\Gamma A1.\Gamma m1;$$

$$\Gamma m2 = a.\Gamma A2 + b - c.\Gamma A2.\Gamma m2; \text{ and}$$

$$\Gamma m3 = a.\Gamma A3 + b - c.\Gamma A3.\Gamma m1$$

where $\Gamma m1$ is a measurement value for the short circuit load condition with $\Gamma A1$ being one, $\Gamma m2$ is a measurement value for the open circuit load condition with $\Gamma A2$ being negative one, and $\Gamma m3$ is a measurement value for the balanced load condition with $\Gamma A3$ being zero.

7. A system for determining a characteristic parameter of a device under test (DUT), comprising:
   a waveform generator for generating a test signal comprising spectral components associated with each of a plurality of a frequencies of interest;
   a test fixture have a series reference impedance adapted to present said test signal to a load comprising at least one of said device under test (DUT), a short circuit, an open circuit and a balanced load; and
   a signal acquisition device coupled to the test fixture adapted to differentially measure across the series reference impedance said test signal during each of said load conditions;
   wherein said signal acquisition device computes an error correction parameter using measurements made during said short circuit, open circuit and balanced load conditions, said error correction parameter being used to compensate for signal acquisition errors within measurements made during said DUT load condition, the characteristic parameter being in the form of a return loss parameter calculated using an equation of the following form:

$$\text{Return loss} = -20\log\frac{\Gamma m - b}{a - c.\Gamma m}.$$

where Γm are the measurements made during said DUT load condition and a, b and c are the error correction parameter.

8. The system of claim 7, wherein said test signal comprises a differential test signal.

9. The system of claim 7, wherein said test fixture comprises:
   a resistive power splitter adapted to split said test signal into a plurality of reduced power test signals; and
   a plurality of substantially resistive bridges, each of said resistive bridges adapted to present a respective reduced power test signal to a respective portion of a device under test (DUT);
   each of said resistive bridges presenting an output impedance adapted to an input impedance of said respective portion of said DUT;
   each of said resistive bridge bridges including reference impedance points adapted to enable signal measurement.

10. The system of claim 7, wherein:
   said test signal is generated by summing a plurality of sine waves having amplitude and phase parameters selected to provide energy at each of said frequencies of interest.

11. The system of claim 10, wherein:
   said phase parameters of said sine waves are adjusted to evenly distribute energy over said frequencies of interest.

12. The system of claim 10, further comprising:
   an arbitrary waveform generator (AWG) for generating said test signal.

13. The system of claim 7, wherein said characteristic parameter of said DUT comprises in addition to the return loss parameter at least one of a transmission coefficient, a return angle parameter, a transmission angle parameter and an impedance parameter.

14. The system of claim 7, wherein said error correction parameter comprises coefficients a, b and c calculated using equations of the following form:

$\Gamma m1 = a.\Gamma A1 + b - c.\Gamma A1.\Gamma m1$;

$\Gamma m2 = a.\Gamma A2 + b - c.\Gamma A2.\Gamma m2$; and $\Gamma m3 = a.\Gamma A3 + b - c.\Gamma A3.\Gamma m1$ wherein ΓA1, ΓA2 and ΓA3 are reflection coefficients for, respectively, the open circuit, short circuit and balanced load conditions.

15. A compensation method adapted for use within a test and measurement device for determining a characteristic parameter of a device under test (DUT), said compensation method performing the steps of:

determining, using a test signal comprising spectral components associated with each of a plurality of frequencies of interest, and for each of a short circuit, open circuit and balanced load condition, a reflection coefficient magnitude and phase of a testing system output port;
   calculating error correction terms adapted to substantially compensate for the determined reflection coefficient magnitude and phase of the testing system output port under the load conditions;
   causing the application of said test signal to a device under test (DUT) operatively coupled to said output port;
   measuring a response of said DUT to said test signal; and
   correcting said measured response of said DUT using said calculated error correction terms to produce a corrected measurement result that represents said characteristic parameter of said DUT.

16. The compensation method of claim 15 wherein the steps are performed in accordance with computer readable instructions stored within a memory of said test and measurement device which are executed by a processor within said test and measurement device.

17. A test system for performing measurements on a device under test (DUT) as a function of frequency including differential return loss measurements comprising:
   a waveform generator for providing a test signal of an arbitrary waveform having signal energy at each of a plurality of frequencies;
   a test fixture having an input to receive the test signal and an output to couple the test signal to a load via a reference impedance, the load being one of a short circuit, an open circuit, a balanced load and the DUT;
   a signal acquisition device coupled to the test fixture for receiving return signals from the test fixture across the reference impedance indicative of a response of the load to the test signal, for determining an error correction function from the return signals for the short circuit, open circuit and balanced load, and for determining from the return signals for the DUT actual measurements after application of the error correction function.

18. The test system as recited in claim 17 wherein the signal acquisition device comprises a digital storage oscilloscope for determining return loss measurements for the DUT, the digital storage oscilloscope coupling across the reference impedance via probes.

19. The test system as recited in claim 17 wherein the test fixture comprises a power splitter to split the test signal into a plurality of lower power test signals for application to the DUT having a plurality of inputs with the digital storage oscilloscope having a corresponding plurality of inputs for receiving the return signals from the test fixture.

* * * * *